(12) United States Patent
Baars et al.

(10) Patent No.: US 8,110,813 B2
(45) Date of Patent: Feb. 7, 2012

(54) CHARGED PARTICLE OPTICAL SYSTEM COMPRISING AN ELECTROSTATIC DEFLECTOR

(75) Inventors: Norman Hendrikus Rudolf Baars, Eindhoven (NL); Gerardus Fernandus Ten Berge, Oosterhout (NL); Stijn Willem Herman Karel Steenbrink, The Hague (NL)

(73) Assignee: Mapper Lithography IP B.V., Delft (NL)

( * ) Notice: Subject to any disclaimer, the term of this patent is extended or adjusted under 35 U.S.C. 154(b) by 64 days.

(21) Appl. No.: 12/769,712

(22) Filed: Apr. 29, 2010

(65) Prior Publication Data
US 2010/0276606 A1 Nov. 4, 2010

Related U.S. Application Data

(60) Provisional application No. 61/173,638, filed on Apr. 29, 2009.

(51) Int. Cl.
*H01J 37/317* (2006.01)
(52) U.S. Cl. .............. 250/396 R; 250/492.1; 250/492.2; 250/493.1; 250/494.1
(58) Field of Classification Search .............. 250/492.1, 250/492.2, 493.1, 494.1, 396 R, 398
See application file for complete search history.

(56) References Cited

U.S. PATENT DOCUMENTS

| | | | |
|---|---|---|---|
| 5,981,962 A * | 11/1999 | Groves et al. ............ | 250/492.23 |
| 6,175,122 B1 | 1/2001 | Groves | |
| 6,897,458 B2 | 5/2005 | Wieland | |
| 2004/0231150 A1 * | 11/2004 | Charles et al. ................. | 29/825 |
| 2005/0087701 A1 * | 4/2005 | Lammer-Pachlinger et al. ....................... | 250/492.22 |

FOREIGN PATENT DOCUMENTS

| | | |
|---|---|---|
| EP | 0488707 A2 | 6/1992 |
| EP | 1389797 A2 | 2/2004 |
| EP | 1993118 A2 | 11/2008 |

OTHER PUBLICATIONS

International search report for PCT/IB2010/051848 (issued Jul. 16, 2010).
Search report of Octrooicentrum Nederland for NL1036912 (issued Jan. 13, 2010).

* cited by examiner

*Primary Examiner* — Michael Maskell
(74) *Attorney, Agent, or Firm* — Hoyng Monegier LLP; David P. Owen; Coraline J. Haitjema

(57) ABSTRACT

A charged particle optical system comprising a beamlet generator for generating a plurality of beamlets of charged particles and an electrostatic deflector for deflecting the beamlets. The electrostatic deflector comprises first and second electrodes adapted for connection to a voltage for generating an electric field between the electrodes for deflection of the beamlets, the electrodes being at least partially freestanding in an active area of the electrostatic deflector. The electrodes define at least one passing window for passage of at least a portion of the beamlets between the electrodes, the passing window having a length in a first direction and a width in a transverse direction. The system is adapted to arrange the beamlets in at least one row and to direct a single row of the beamlets through the passing window of the electrostatic deflector, the beamlets of the row extending in the first direction. A substantial part of the electrostatic deflector extends beyond the passing window in the first direction.

23 Claims, 6 Drawing Sheets

CHARGED PARTICLE OPTICAL SYSTEM COMPRISING AN ELECTROSTATIC DEFLECTOR

This application claims priority to U.S. provisional application No. 61/173,638 filed on Apr. 29, 2009, which is hereby incorporated by reference in its entirety.

BACKGROUND OF THE INVENTION

1. Field of the Invention

The present invention relates to a charged particle optical system comprising an electrostatic deflector for the deflection of at least one beamlet of charged particles, which deflector comprises a first and a second electrode between which the beamlet passes, which beamlet is deflected upon setting a potential difference between the electrodes.

The invention further relates to the use of such charged particle optical system

2. Description of the Related Art

One such charged particle system is known from U.S. Pat. No. 6,897,458. This system is a maskless lithography system. According to this lithography system, a beam of charged particles, such as electrons, is split in an aperture plate into a plurality of beamlets. The beamlets are subsequently focused to a desired diameter and pass a beamlet blanker array comprising blanking electrostatic deflectors. On application of a voltage to the blanking deflector, a beamlet is deflected so as to terminate at a beamlet stop array located behind the beamlet blanker array. Without deflection, the beamlet reaches a set of lenses to focus the beamlet on the target surface. Scanning deflection means move the beamlets together in one direction over the target surface.

Electrostatic deflectors may be used for the blanking deflectors and the scanning deflectors in such a maskless lithography system and in other high-speed deflection applications. Typical examples are oscilloscope tubes, electron beam lithography systems and inspection systems, and streak cameras. A common type of electrostatic deflector is a planar deflector, which comprises two parallel plates with opposite voltages +V and −V. An electric field is therewith generated in the (x−) direction normal to the plates. Such planar deflector deflects a beam in one direction only. The disadvantage of planar deflectors is that x and y deflections must be applied sequentially at different distances (i.e. different z-positions) to a target, for instance a wafer of semiconductor material.

Another type of deflector is a multi-pole deflector, the most common instance thereof is an octopole deflector consisting of curved plates with cylindrical or conical segments. By applying a suitable combination of electrode potentials to the plates, deflections in two orthogonal directions (x and y) can be applied simultaneously. A disadvantage of this deflector type is its complex construction.

U.S. Pat. No. 6,897,458 specifies a specific electrostatic deflector of the planar type for use as scanning deflection means. This deflector comprises electrodes arranged to deflect an assembly of electron beamlets in a single direction. The electrodes may be deposited in the form of strips on a suitable plate. Alternatively, the strip-shaped electrodes may be deposited on the set of projection lenses, at the side facing the target surface, or alternatively on a separate plate between the set of lenses and the target surface.

FIG. 10 shows a diagrammatical cross-sectional view of a portion of this electrostatic deflector 11. The deflector 11 comprises a first strip 131, a second strip 132 and a third strip 133, which are present on a substrate 150. Passing windows 140, e.g. through-holes, extend through the substrate 150 between the strips 131, 132, 133. The system is designed in such a manner that beamlets of charged particles, i.e. electrons, pass through the passing windows 140. The first and third strip 131, 133 are part of the first electrode, while the second strip 132 forms part of the second electrode. Therefore, the second strip 132 has an opposite polarity to that of the first and the second strip 131, 133. In this example, the second strip 132 is the negative pole. On application of a potential difference between the first and the second electrode, an electric field is generated towards the second strip 132. In view of the consecutive row of electrode strips 131, 132, 133 of opposite polarity, the electric field generated between the first and the second strip 131, 132 has a direction opposite to the electric field generated between the second and the third strip 132, 133. As a result, the beamlets 7 are deflected by the electric field in opposing directions as shown in FIG. 10.

This deflection is disadvantageous because a surface area covered by a grid of the beamlets 7 is larger when the beamlets 7 are deflected than when not deflected. That difference in surface area causes problems for writing a pattern on a target surface that is much larger than the surface area. Then, the patterns of neighboring surface areas need to fit together without any undesired overlaps or gaps in between.

Another type of electrostatic deflector is known from EP1993118. This type is a blanker deflector using an array of electrodes protruding from a substrate. The array is designed to enable deflection in two directions simultaneously and to allow individual addressing of individual electrodes in the array. The latter feature results from the requirement that each beamlet in a blanker deflector is to be deflected separately. Holes are present in the substrate between the electrodes—one active, one ground or opposite polarity—to allow any beamlet to pass. The electrodes have a wall-shaped form and may be formed on two substrates stacked together in such a manner that the electrodes at least partially face each other. The height of these electrodes is in the order of 35-50 μm, the mutual distance may be less than 10 μm. In the event that the electrodes are present on the same substrate, the height may be less than 10 μm and their mutual distance in the order of 0.5-2 times their height. The substrate may be thinned below the membrane with the protruding electrodes.

However, this type of deflector has the limitation that it provides insufficient uniformity if intended for application as a scanning deflector. The presence of one of the electrodes on a second substrate leads to the generation of stray fields and hardly controllable effects. This is not problematic for its use as a blanker deflector; if a potential difference is applied between the electrodes in the blanker deflector, a beamlet will be deflected to terminate at a beam stop. A slightly larger or smaller deflection does not matter as long as it terminates anywhere at the beam stop. But when applied as scanning deflector, such variation would immediately result in a decrease of the resolution of the provided pattern. Additionally, the stray fields may lead to a reduction of homogeneity of the beamlet. This may result in insufficient resist development and/or wrong beam positioning, and therewith non-adequate (i.e. failed) pattern generation.

In short, the prior art has shortcomings that are to be overcome by the invention.

BRIEF SUMMARY OF THE INVENTION

In a first aspect of the invention, a charged particle optical system comprises a beamlet generator for generating a plurality of beamlets of charged particles and an electrostatic deflector for deflecting the beamlets. The electrostatic deflector comprises first and second electrodes adapted for connection to a voltage for generating an electric field between the electrodes for deflection of the beamlets, the electrodes being at least partially freestanding in an active area of the electrostatic deflector. The electrodes define at least one passing window for passage of at least a portion of the beamlets between the electrodes, the passing window having a length in a first direction and a width in a transverse direction. The system is adapted to arrange the beamlets in at least one row and to direct a single row of the beamlets through the passing window of the electrostatic deflector, the beamlets of the row extending in the first direction. A substantial part of the electrostatic deflector extends beyond the passing window in the first direction.

The deflector comprises a first and a second electrode between which the beamlet passes, and each of the electrodes may comprise at least one strip, which is at least partially freestanding. The deflector in the charged particle optical system of the invention has due to its electrodes being at least partially freestanding the advantage that an electric field with uniform field strength can be provided. This better uniformity is based on contributions from several effects: first, the use of freestanding strips implies the absence of a continuous character that easily impacts the uniformity in a negative way. For instance, an insulating carrier may affect the system as a parasitic capacitor. Moreover, freestanding electrodes can be made in a single etching step. This allows a reduction in the distance between electrodes, and therewith a reduction of the potential voltage difference over the electrodes. Such reduction leads again to a better uniformity of the deflector, particularly when applied in combination with a high scanning frequency, e.g. more than 100 kHz, preferably in the range of 300-3000 kHz, more preferably between 500 and 1500 kHz.

Additionally, the strip may be provided with a relatively large surface area at the strip's side face normal to the direction of the electric field. The provision of such large surface area additionally will improve the mechanical stability of the freestanding strips. As a result thereof, the contribution of the electric field span up between two opposing strips is big in comparison to that of the stray component of the electric field. This is advantageous, as the stray component is difficult to predict and control and thus tends to give rise to deviations of the intended beamlet trajectory. Overall, therewith the deflection is better controlled.

Suitably, the field is uniform over a grid of beamlets instead of individually addressing a single beamlet. Due to these features the deflector is particularly advantageous for the scanning deflection operation, though any other use is not excluded. Particularly its fine precision and homogeneous output enables its use for other deflection and/or filtering operations.

In a suitable embodiment, the strips are located at small distance of each other in comparison to the surface area facing the opposing strip, e.g. each electrode comprises at least one strip, the strips extending substantially in parallel and defining a passing window through which a plurality of beamlets passes, the passing window having a width in a direction normal to the strips, in which direction an electric field is generated upon setting the potential difference between the electrodes, the strips having a height, a width and a lateral direction in three mutually perpendicular directions, the height of the strip being larger than the width of the passing window. This leads to a big direct field, in comparison to the stray field, and to a good uniformity of the field.

Moreover, relatively short distances enable relatively small driving voltages, while still meeting requirements of deflection angles. A design with small driving voltages, for instance smaller than 10V is effective for a more than one reason; first, the driving electronics to provide the voltages at switching frequencies of 1 MHz or more can be kept relatively simple; no dedicated high voltage power transistors are needed which would consume a lot of power and/or may constitute components that have a life time that may be critical and limiting overall. Additionally, with a small voltage, the risk of a uncontrolled discharge between electrodes with damaging effectively is strongly reduced. That is good for reliability and robustness.

In a further embodiment, a plurality of passing windows is present, the orientation of the electric field in each passing window being the same. Scanning in a single orientation turns out to simplify the provision of the patterning data to the beamlets. This overall leads to higher accuracy of the scanning process, and improved stitching of the lines and/or pixels scanned by different beamlets. The term 'orientation' is used herein in contrast to the term 'direction': there are three Cartesian directions x, y, z and two orientations coupled to one direction. The term 'same orientation' is not intended to imply that the electric field in one passing window has a constant orientation in time. Effectively, it is preferable that the orientation of the electric field is reversed within one single scanning period. However, the term is intended that the electric field in different passing windows at any moment in time has the same orientation. Preferably, the electric field in different passing windows has at any moment in time the same magnitude as well.

Suitably, an isolation domain, preferably an isolation window, is present between a first and a second passing window. This is a robust implementation to create passing windows with equally directed electric fields. Surprisingly, it has been found that the specified pitch between beamlets can be met, even though the addition of such an isolation window. This appears an advantageous effect of the use of freestanding electrode strips, which preferably are located at short distance to each other. The term 'short distance' is used herein to express a short distance relative to the distance of the electrodes in a prior art macroscopic deflector as well as relative to the other dimensions within the deflector, such as the height of the strips and/or the distance between neighboring passing windows.

Suitably, at least one terminating resistance is present. Such a terminating resistance accelerates positioning of a beamlet, between a first and a second scanning period. The term 'positioning' herein particularly refers to positioning of the beamlet to a starting position for scanning of a subsequent line during the second scanning period. Therewith, a beamlet is deflected in the same orientation in both the first and the scanning period, and preferably in all scanning periods. Positioning of a beamlet, without simultaneously writing is achieved by bringing the voltage over the electrodes to a starting value corresponding to the starting position and additionally switching the beamlet off through operation of a beamlet blanker upwards in the column. The deflection of a beamlet in the same orientation in subsequent scanning periods turns out to simplify the provision of patterning data to the beamlets. Most suitably, all beamlets are deflected in the same orientation.

In a first implementation, the terminating resistance is electrically coupled in parallel to the electrode system. In a second implementation, a first terminating resistance is electrically coupled between the first electrode and ground, and a second terminating resistance is electrically coupled between the second electrode and ground. The provision of the terminating resistance in one of the implementations damps out a parasitic capacitance in the deflector, which capacitance tends to slow down any switch back of the potential difference. It is not excluded to use the first and second implementations in combination. The terminating resistance is suitably integrated into the deflector; examples include resistors of polysilicon, TaN, TiWN, CrSi as typically applied in passive and active integrated circuits.

In another embodiment, an edge zone is present, which at least partially overlies the aperture in the substrate. The edge zones comprise strips of the electrodes to define an electric field in the same orientation as the above mentioned electric field, but being devoid of passing windows for beamlets. Suitably, the edge zone is embodied as an extension of an interdigitated pair of electrodes. However, it is designed to be free of beamlets. The addition of such edge zone turns out to be very beneficial for the uniformity of the electric field. It is most beneficial in a design wherein the first and second electrodes are put to voltages of opposite polarity and an additional ground electrode is defined adjacent to the electrode system.

In a further embodiment, the freestanding electrodes are covered with a coating so as to provide an electrically substantially homogeneous surface. Such coating is to prevent that local variations in the surface structure are more or less active to set up the electric field between the electrodes. Therewith, it contributes to the uniformity of the electric field. Moreover, such homogeneity tends to reduce the risk of electrostatic discharge.

In another embodiment, a second electrostatic deflector is present that deflects in a different direction than the—first—deflector. The different direction may be a direction opposite or perpendicular to the scanning direction, or any other direction different from the scanning direction. It is in particular a direction within the optical plane (e.g. a plane from which the optical axis exits as a normal). Corrections perpendicular to the scanning directions are useful in view of the simultaneously ongoing movement of the lithography system with respect to the target surface. This movement, also referred to as the mechanical scan, is suitably in the same direction as that of the further deflector. Such a correction is suitably carried out at a lower frequency than the scanning frequency. A deflection in opposite direction to the scanning direction is suitably carried out with a deflector of the same type as the one used for the scanning In fact, such deflection is a part of the scanning. It is herewith accomplished that a beamlet passes through the centre part of the optical axis in the effective lens plane of the projection lens arrangement even when deflected. In this manner, spherical aberrations caused by deflection through the projection lens arrangement are reduced.

In a second aspect of the invention, a charged particle optical system comprising a scanning electrostatic deflector for the deflection of at least one beamlet of charged particles is provided. The deflector comprises a first and a second electrode between which the beamlet passes through a passing window and is deflected under operation of an electric field, if any, between the electrodes, wherein a plurality of passing windows is present, the orientation of the electric field in each passing window being the same.

Scanning in a single orientation turns out to simplify the provision of the patterning data to the beamlets. This overall leads to higher accuracy of the scanning process, and improved stitching of the lines and/or pixels scanned by different beamlets.

More specifically, the deflector is designed to a have a substantially uniform electric field within an active area of the deflector. Surprisingly, it has turned out possible to get a deflector with a uniform field, even though electrodes are defined within this active area. Any potential field disturbers, such as interconnects, capacitors, are defined outside the active area. Additionally, edge zones may be specified bordering the active area to flatten non-uniformities due to edge effects. In one embodiment the field is suppressed outside the active area. Such suppression is for instance implemented by the provision of isolating materials. In a preferred embodiment, the field is generated only within the active area.

One preferred embodiment of achieving the operation within the active area only is the use of an interdigitated pair of strip-like shaped electrodes. Another manner of getting such operation is to a structure, wherein the active area is defined by absence of a underlying carrier. The absence of such underlying carrier immediately implies that in that area the field is not disturbed by any unavoidable interaction with the underlying carrier. Most suitably, a combination of both manners is applied. An elegant manner hereof is the provision of freestanding electrode strips.

In a third aspect of the invention, use of the charged particle optical system is provided. Suitably, the deflector is used for deflection of at least one beamlet of charged particles. Preferably, the deflector is used for the deflection of a plurality of beamlets. It is most suitable that voltages of opposite polarity to the first and the second electrode of the deflector. It has turned out that driving the deflector with opposite voltages around a ground value (either 0 Volt or another value) provides best results. Here it is to be understood that for a proper scanning the voltages on the electrodes vary in accordance with a predetermined voltage profile. A sawtooth profile turns out highly advantageous, particularly in combination with a structure in which anywhere within the deflector the electric field has the same orientation. In accordance with the present invention, it is preferable that the opposite voltages on the electrodes are equal in magnitude and smaller than 10V. The 10V is herein the maximum applied voltage difference with the ground for the positive polarity; this will be −10V for the negative polarity. More suitably, the voltages are even smaller, for instance with a maximum voltage of 7, 5 or 4 Volt. Such small voltages are enabled through the inventive deflector, where the freestanding electrodes at short distance of each other provide a deflection strength similar to those of a prior art deflectors. Most preferably, the scanning frequency is relatively large, suitably in the RF range, more preferably in medium RF between 300 and 3000 kHz, for instance 0.5-1.2 MHz.

Suitably, the modulated beamlet is positioned to a starting position in a positioning period without exposing a target surface, and deflected from the starting position in a writing period. This alternation of positioning and scanning is particularly done as a sawtooth profile. It turns out to improve the uniformity of the scanning.

Most suitably, the scanning frequency is in a radio frequency (RF) range and each beamlet is deflected in the same orientation as other beamlets both within a scanning period and in subsequent scanning periods; and the positioning period is shorter than the writing period. Herein, it achieved that one may accurately scan a pattern with sufficient speed including high-frequency scanning in one direction combined with a reduction of positioning time by suppressing parasitic capacitance.

The use is particularly exploited in a method of projecting a predetermined pattern on a target surface by means of a maskless lithography system. It is therein applied for scanning the pattern on the target surface. This method comprises the steps of generating a plurality of beamlets; modulating a magnitude of a beamlet using modulation means provided with data of the predetermined pattern retrieved from a data storage; focusing the modulated beamlets onto the target surface using focusing means, and scanning the pattern on the target surface by electrostatically deflecting the modulated beamlets.

In a further aspect of the invention the electrostatic deflector comprises a first and a second electrode which are at least partially freestanding, the deflector deflecting the plurality of beamlets by operation of an electric field between the electrodes between which the plurality of beamlets passes, the plurality of beamlets defining a passing window and a dimension of the passing window in a direction transverse to the first direction matching a diameter of the beamlets, the passing window extending in a first direction, the plurality of beamlets is arranged in a single row extending in the first direction and wherein a substantial part of the electrostatic deflector extends beyond the passing window in the first direction. Preferably the substantial part extends in the first direction a number of times the pitch of the beams in the passing window. The deflector deflects the beamlets transverse to the first direction over a subdivision within the surface of the target, such as a field on a wafer, wherein the deflector is a scanning deflector for performing the final writing projection of the system.

For sake of clarity, it is observed that any of the embodiments outlined hereinabove and claimed in one of the dependent claims may be combined with any of the aspects of the invention as specified in the independent claims.

BRIEF DESCRIPTION OF THE DRAWINGS

These and other aspects of the invention will be further explained with reference to the Figures, in which.

DESCRIPTION OF ILLUSTRATIVE EMBODIMENTS

In the Figures, identical reference numbers relate to identical or at least comparable technical features. The Figures are not drawn to scale and are intended for illustrative purposes only. The Figures show examples which are not intended to limit the claims. The following is a description of certain embodiments of the invention.

Figure 1:
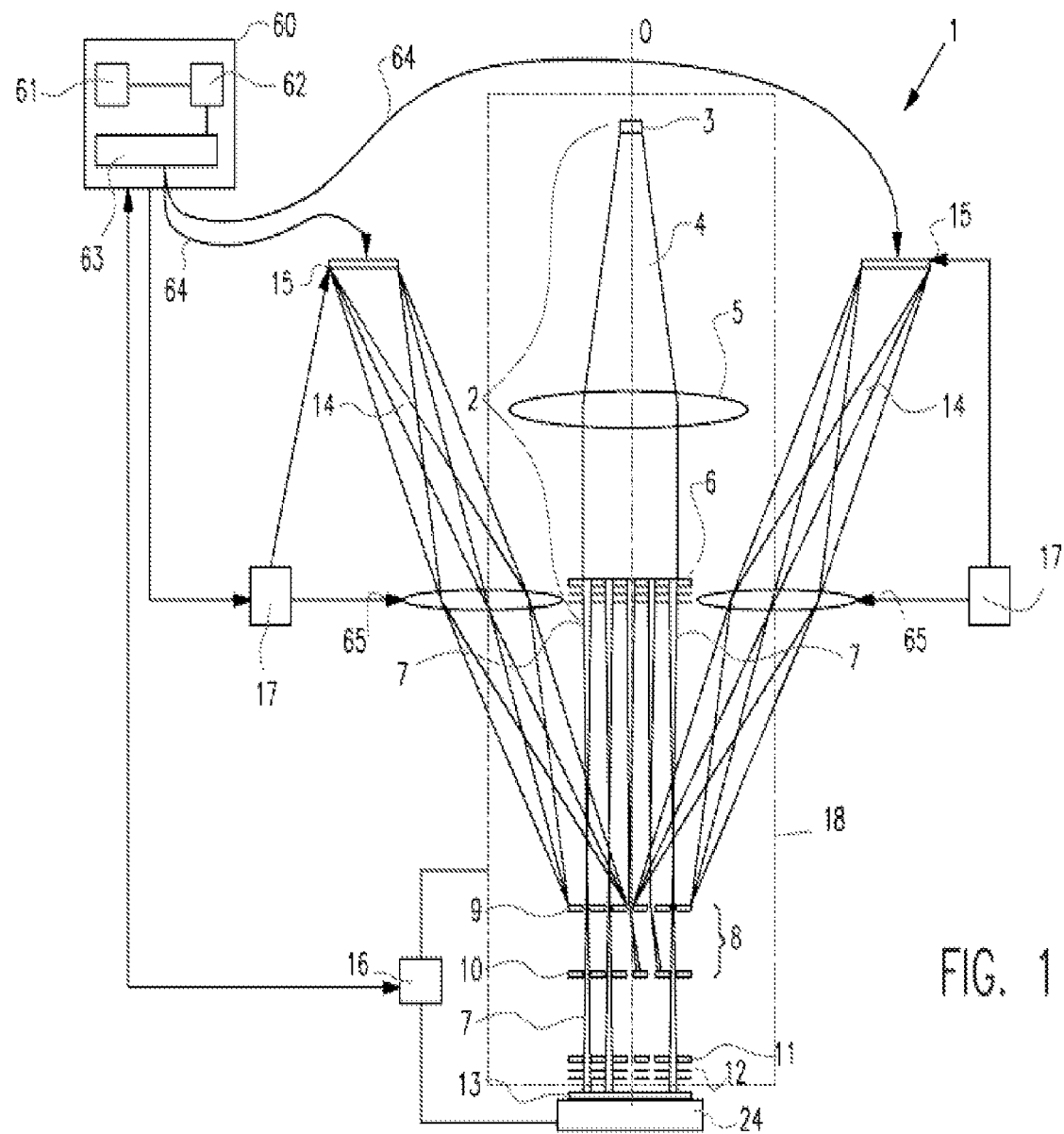
FIG. 1 shows a simplified schematic drawing of an embodiment of a charged particle multi-beamlet lithography system.

FIG. 1 shows a simplified schematic drawing of an embodiment of a charged particle multi-beamlet lithography system based upon an electron beam optical system without a common cross-over of all the electron beamlets. Such lithography systems are described for example in U.S. Pat. Nos. 6,897,458 and 6,958,804 and 7,084,414 and 7,129,502, which are hereby incorporated by reference in their entirety, assigned to the owner if the present invention. Such a lithography system suitably comprises a beamlet generator generating a plurality of beamlets, a beamlet modulator patterning the beamlets into modulated beamlets, and a beamlet projector for projecting the beamlets onto a surface of a target. The beamlet generator typically comprises a source and at least one aperture array. The beamlet modulator is typically a beamlet blanker with a blanking deflector array and a beam stop array. The beamlet projector typically comprises a scanning deflector and a projection lens system.

The lithography system suitably includes the functionality of a redundancy scan. Such a functionality is known from international patent application no. WO 2007/013802 assigned to the assignee of the present application and is incorporated herein by reference in its entirety. According to this functionality, compensation for failing, i.e. invalid beamlets, is provided so that the reliability of the lithography system may be increased dramatically. In addition to the elements, a lithography system for redundancy scanning may include a sensor and control unit coupled thereto, so as to identify invalid beamlets with properties outside predefined specifications. This control unit is coupled to a system control for switching specific beamlets on or off and actuating the system with respect to the target, or vice versa, to replace invalid beamlets with valid beamlets. Preferably, projection of any invalid beamlets is prevented. As a result, unwritten pattern elements are left. The unwritten pattern elements are thereafter transferred onto the target surface by scanning valid replacement beamlets over the surface.

As will become clear in the following description, the lithography system 1 of the invention is well suited for implementing the redundancy scan functionality. Its achieved improvement in the accuracy of scanning lines onto the target surfaces enables a second scan to be carried out that exactly fills a gap left open in a first scanning sequence.

In the embodiment shown in FIG. 1, the lithography system comprises an electron source 3 for producing a homogeneous, expanding electron beam 4. Beam energy is preferably maintained relatively low in the range of about 1 to 10 keV. To achieve this, the acceleration voltage is preferably low, the electron source preferably kept at between about −1 to −10 kV with respect to the target at ground potential, although other settings may also be used.

The electron beam 4 from the electron source 3 passes a double octopole and subsequently a collimator lens 5 for collimating the electron beam 4. As will be understood, the collimator lens 5 may be any type of collimating optical system. Subsequently, the electron beam 4 impinges on a beam splitter, which is in one suitable embodiment an aperture array 6. The aperture array 6 blocks part of the beam and allows a plurality of beamlets 7 to pass through the aperture array 6. The aperture array preferably comprises a plate having through-holes. Thus, a plurality of parallel electron beamlets 7 is produced. The system generates a large number of beamlets 7, preferably about 10,000 to 1,000,000 beamlets, although it is of course possible to use more or less beamlets. Note that other known methods may also be used to generate collimated beamlets.

The plurality of electron beamlets 7 pass through a condenser lens array—not shown in the figure—which focuses each of the electron beamlets 7 in the plane of beamlet blanker array 9. This beamlet blanker array 9 preferably comprises a plurality of blankers, which are each capable of deflecting one or more of the electron beamlets 7. The beamlet blanker array 9 constitutes with a beam stop array 10 a modulating system 8. On the basis of input from a control unit 60, the modulating system 8 adds a pattern to the electron beamlets 7. The pattern will be positioned on the target surface 13 by means of components present within an end module.

In this embodiment, the beam stop array 10 comprises an array of apertures for allowing beamlets to pass through. The beam stop array, in its basic form, comprises a substrate provided with through-holes, typically round holes although other shapes may also be used. In one embodiment, the substrate of the beam stop array 8 is formed from a silicon wafer with a regularly spaced array of through-holes, and may be coated with a surface layer of a metal to prevent surface charging. In one embodiment, the metal is of a type that does not form a native-oxide skin, such as CrMo.

In one embodiment, the passages of the beam stop array 10 are aligned with the elements of the beamlet blanker array 9. The beamlet blanker array 9 and the beamlet stop array 10 operate together to block or let pass the beamlets 7. If beamlet blanker array 9 deflects a beamlet, it will not pass through the corresponding aperture in beamlet stop array 10, but instead will be blocked by the substrate of beamlet block array 10. But if beamlet blanker array 9 does not deflect a beamlet, then it will pass through the corresponding apertures in beamlet stop array 10 and will then be projected as a spot on a target surface 13 of the target 24.

The lithography system furthermore comprises a control unit 60 comprising data storage 61, a read out unit 62 and data converter 63. The control unit 60 may be located remote from the rest of the system, for instance outside the inner part of a clean room. Using optical fibers 64, modulated light beams holding pattern data are transmitted to a projector 65 which projects the ends of the fibers (schematically depicted in plate 15) into the electron optical unit 18, here on to the modulation array 9. Modulated light beams 8 from each optical fiber end are projected on a light sensitive element of a modulator on the beamlet blanker array 9. Each light beam 14 holds a part of the pattern data for controlling one or more modulators. Suitably, use is made of transmitting means 17 enabling that the projector 65 is appropriately aligned with the plate 15 at the ends of the fibers.

Subsequently, the electron beamlets 7 enter the end module. Hereinafter, the term 'beamlet' to refer to a modulated beamlet. Such a modulated beamlet effectively comprises time-wise sequential portions. Some of these sequential portions may have a lower intensity and preferably have zero intensity—i.e. portions stopped at the beam stop. Some portions will have zero intensity in order to allow positioning of the beamlet to a starting position for a subsequent scanning period.

The end module is preferably constructed as an insertable, replaceable unit, which comprises various components. In this embodiment, the end module comprises a beam stop array 10, a scanning deflector array 11, and a projection lens arrangement 12, although not all of these need be included in the end module and they may be arranged differently. The end module will, amongst other functions, provide a demagnification of about 100 to 500 times, preferably as large as possible, e.g. in the range 300 to 500 times. The end module preferably deflects the beamlets as described below. After leaving the end module, the beamlets 7 impinge on a target surface 13 positioned at a target plane. For lithography applications, the target usually comprises a wafer provided with a charged-particle sensitive layer or resist layer.

After passing the beamlet stop array 10, the thus modulated beamlets 7 pass through a scanning deflector array 11 that provides for deflection of each beamlet 7 in the X- and/or Y-direction, substantially perpendicular to the direction of the undeflected beamlets 7. In this invention, the deflector array 11 is a scanning electrostatic deflector enabling the application of relatively small driving voltages, as will be explained hereinafter. Next, the beamlets 21 pass through projection lens arrangement 12 and are projected onto a target surface 13 of a target, typically a wafer, in a target plane. The projection lens arrangement 12 focuses the beamlet, preferably resulting in a geometric spot size of about 10 to 30 nanometers in diameter. The projection lens arrangement 12 in such a design preferably provides a demagnification of about 100 to 500 times. In this preferred embodiment, the projection lens arrangement 12 is advantageously located close to the target surface 13. In other embodiments, protection means may be located between the target surface 13 and the focusing projection lens arrangement 12. The protection means may be a foil or a plate or the like, provided with needed apertures, to absorb the released resist particles before they can reach any of the sensitive elements in the lithography system. Alternatively or additionally, the scanning deflection array 9 may be provided between the projection lens arrangement 12 and the target surface 13.

Roughly speaking, the projection lens arrangement 12 focuses the beamlets 7 to the target surface 13. Therewith, it further ensures that the spot size of a single pixel is correct. The scanning deflector 11 deflects the beamlets 7 over the target surface 13. Therewith, it needs to ensure that the position of a pixel on the target surface 13 is correct on a microscale. Particularly, the operation of the scanning deflector 11 needs to ensure that a pixel is precisely located into a grid of pixels which ultimately constitutes the pattern on the target surface 13. It will be understood that the macroscale positioning of the pixel on the target surface is suitably enabled by wafer positioning means present below the target 13.

Such high-quality projection is relevant to obtain a lithography system that provides a reproducible result. Commonly, the target surface 13 comprises a resist film on top of a substrate. Portions of the resist film will be chemically modified by application of the beamlets of charged particles, i.e. electrons. As a result thereof, the irradiated portion of the film will be more or less soluble in a developer, resulting in a resist pattern on a wafer. The resist pattern on the wafer can subsequently be transferred to an underlying layer, i.e. by implementation, etching and/or deposition steps as known in the art of semiconductor manufacturing. Evidently, if the irradiation is not uniform, the resist may not be developed in a uniform manner, leading to mistakes in the pattern. Moreover, many of such lithography systems make use of a plurality of beamlets. No difference in irradiation ought to result from deflection steps.

The current invention addresses this object of precise and uniform projection of the plurality of scanning beamlets on the target surface 13. The use of freestanding electrodes in the scanning deflector 11 allow the creation of a very uniform electric field, and result in a uniform deflection of beamlets meeting the above objective. Additionally, it turned out to be possible to manufacture the freestanding electrodes with appropriate mechanical strength and without giving rise to new engineering problems that would be even more difficult to solve. In one suitable embodiment, the freestanding electrodes have one or more mechanical resonance frequencies well below and/or above a chosen operating frequency of the scanning deflector. In other words, in this embodiment, energizing the electrodes with differential voltages does not lead to vibration of the freestanding electrodes. Such vibration would be detrimental to forming a uniform field between the electrodes. Particularly, in one embodiment, the freestanding electrodes were provided with a surface structure that results in merely minor fluctuations and/or disturbances in the electric field.

Figure 2:
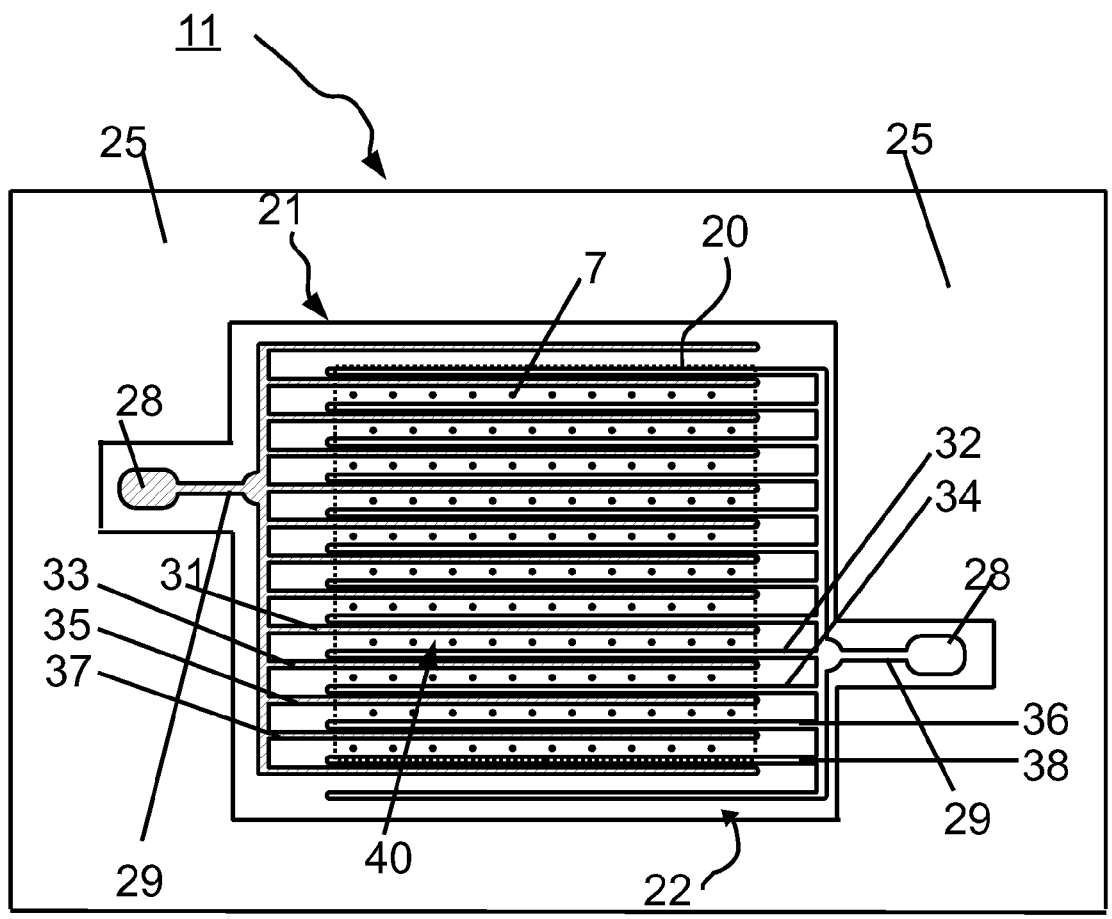
FIG. 2 shows a top view of a preferred embodiment of the invention.
Figure 3:
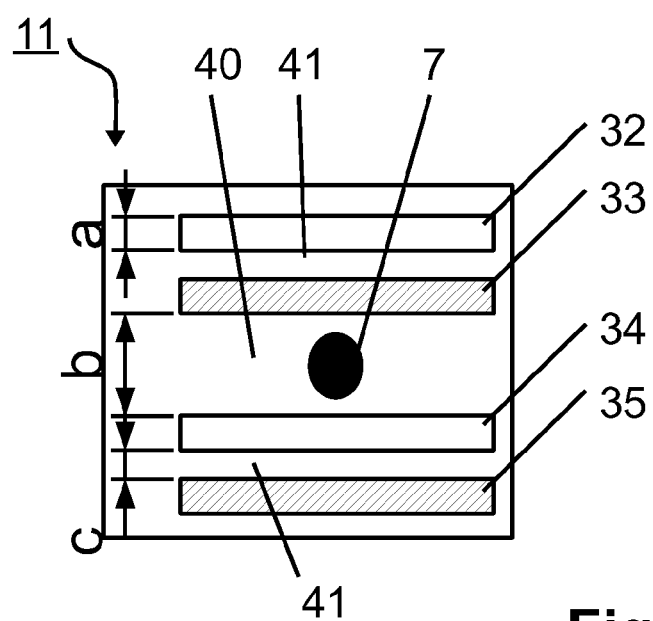
FIG. 3 shows a detail of FIG. 2 in enlarged view.
Figure 4:
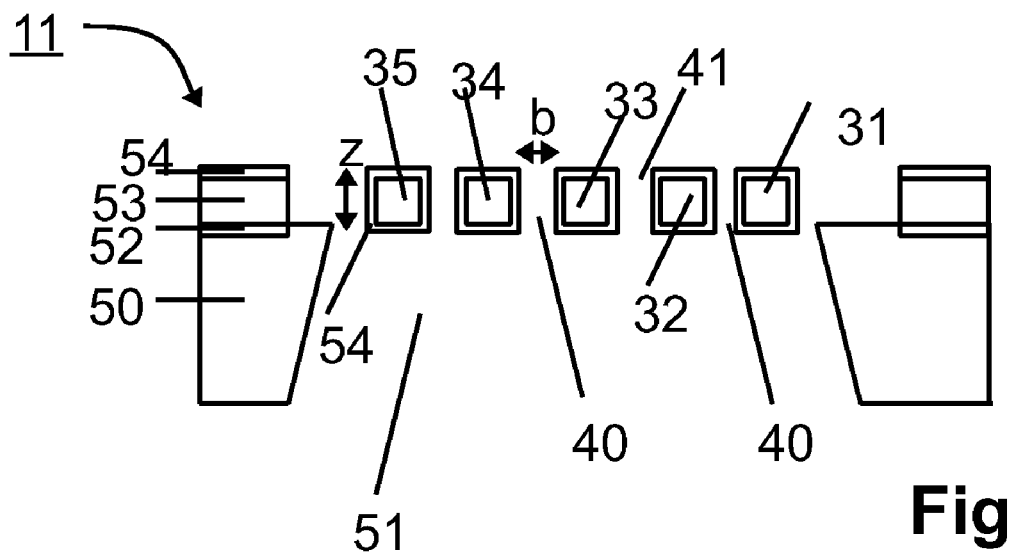
FIG. 4 shows a diagrammatical cross-sectional drawing of the embodiment of FIG. 2.
Figure 5:
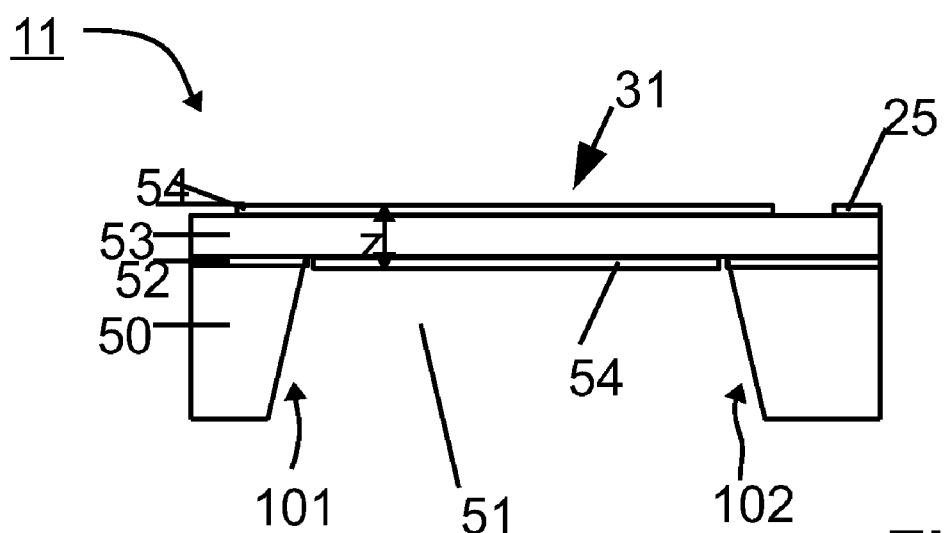
FIG. 5 shows a diagrammatical cross-sectional drawing of the embodiment of FIG. 2 in a direction perpendicular to that of FIG. 4.
Figure 9:
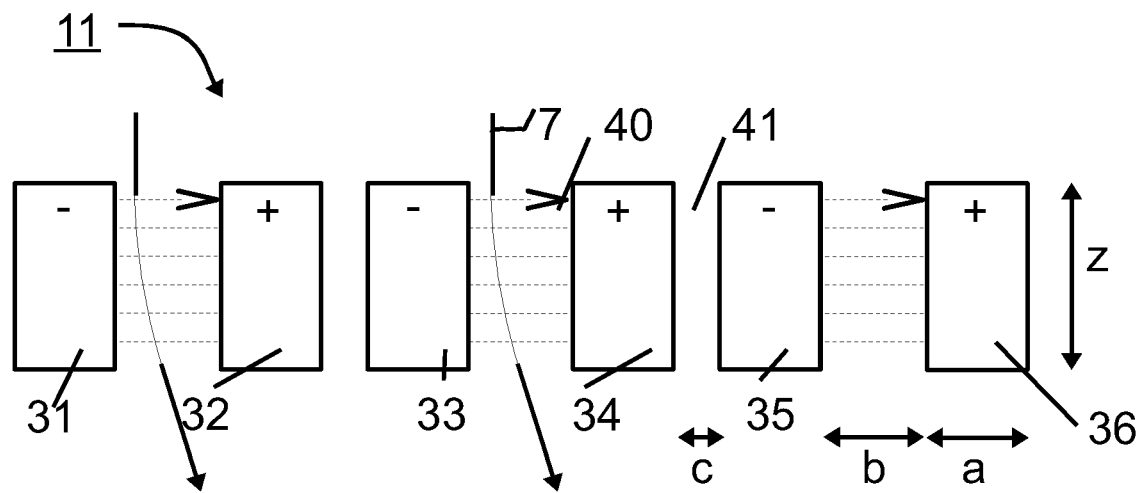
FIG. 9 shows a simplified, diagrammatical cross-sectional view of a portion of the electrostatic deflector of the invention.

FIG. 2 shows a top view of one embodiment of the electrostatic scanning deflector 11 of the invention. FIG. 3 shows an enlarged view of a portion of FIG. 2. FIG. 4 discloses a schematic cross-sectional view in a first direction. FIG. 5 shows a schematic cross-sectional view in a direction perpendicular to that of FIG. 4. FIG. 9 shows a simplified view.

FIG. 2 shows a number of consecutive strips 31-38, which are part of the comb-structured first electrode 21 or the comb-structured second electrode 22. In this embodiment, the strips 31-38 together constitute an interdigitated pair of electrodes; this will hereinafter also be referred to as an electrode system. The substrate 50 herein supports the electrode system; however the electrode system at least partially and suitably largely overlies an aperture 51 in the substrate 50 (shown in FIG. 4). It is observed that FIG. 4 only shows consecutive strips 31-35 for clarity, but it illustrates even with such reduced number of strips the principle adequately. Suitably, the consecutive strips form bridges extending from a first side 101 to a second side 102 of the aperture 51. However, that is not deemed necessary, as will be shown with reference to FIG. 7.

For reasons of clarity, it is observed that the field is generated effectively in an active area 20, as indicated with a dotted line in FIG. 2, where the interdigitated fingers of the electrodes overlap. The freestanding electrodes of the present embodiment generate the field primarily via their side faces. There are no such side faces outside the active area 20. However, the active area 20 may be defined differently. The term 'at least partially freestanding electrodes' is meant to describe that any portion of the relevant conductors present within the active area may be freestanding or partly freestanding. The term 'freestanding' is meant to describe that these conductors are not supported by means of any membrane or other carrier in the active area. The term 'partly freestanding' is intended to describe the situation in which these conductors are locally and/or over a limited area supported by a membrane, by mechanical posts, or by any other support structure. In the preferred embodiment the consecutive strips are freestanding in the active area, and thus the electrodes are at least partially freestanding.

Windows 40, 41 extend between the strips. Some of those are passing windows 40, while others are isolation domains 41. In this preferred example, the isolation domains 41 are windows, e.g. are free space not filled with any dielectric or other material. The passing windows 40 have a width b. Passing windows 40 are windows through which a beamlet 7 is designed to pass. Passing windows may be holes designed for a couple of beamlets 7, or grooves fully extending between the strips of the electrodes. If a passing window 40 is limited to a couple of beamlets 7, the limitation may be due to the provision of a support structure (such as posts or beams for instance extending perpendicular to the strips). However, there may be other reasons to limit a passing window 40. The provision of a relatively long passing window is however advantageous to obtain maximum uniformity; any interruption or limitation of a passing window will likely give rise to a variation of the electric field.

Preferably, the number of consecutive strips is relatively large and their mutual distance short. The strips 31-38 have a lateral dimension, a width a and a height z. An isolation window 41 has a width c. Suitably, the width b of a passing window 40 is smaller than the total distance 2a+c between passing windows 40. More suitably, the width b of a passing window 40 is chosen such that at most three rows of electron beamlets 7 pass through the passing window 40. More preferably, the number of rows is two and most preferably, the number of rows is one. A reduction of the number of rows turns out beneficial for the generation of a uniform field. The field lines mostly run in a direction normal to the lateral extension of the strips 31-38. This is a clear improvement over a prior art macroscopic deflector with two, for instance U-electrodes on opposite sides of an aperture. The field strength of such a deflector is not uniform. Particularly near to corners of the electrodes, the field strength is higher and the sides anyhow lead to disturbances of the electric field. In the scanning deflector 11 according to the invention, the field strength is extremely uniform and clearly more uniform than in the prior art. The scanning deflector demonstrates a variation in deflection strength of less than 5%, more preferably less than 3% and most preferably even less than 2%. In one embodiment of the invention, a variation in deflection strength between 1 and 1.5% has been achieved.

As a result of such narrow width b of the passing window 40, the potential difference 21, 22 over the electrodes may be reduced considerably, while still obtaining a sufficient deflection angle.

The reduction in potential difference over the electrodes has major benefits. First, the deflector can be driven electrically in a better way; i.e. the provision of the—varying—voltage difference over the electrodes may be increased in speed and/or with a higher bandwidth. The term 'bandwidth' is used herein as a measure for the uniformity of application of the electrical signal. A bandwidth that is too low, may cause problems such as uncontrollable delay and variations in the timing of providing the voltage difference and variations in the magnitude of the voltage difference. Secondly, the risk of damage to the deflector as a consequence of electrostatic discharge is reduced.

In order to optimize the stiffness, the height z of the strips 31 is designed to be relatively large. Suitably, the height z is larger than the width b of the passing window 40. Moreover, the larger height serves to increase the so-called deflection strength, or alternatively reduce the needed potential difference for a given deflection angle.

Figure 10:
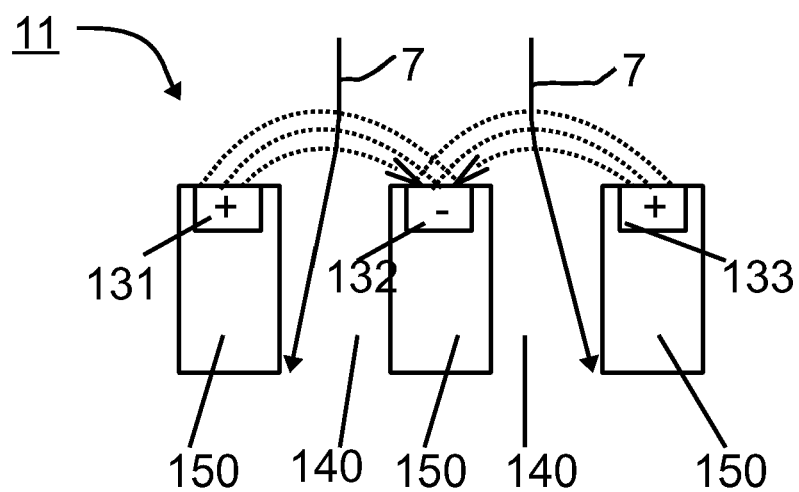
FIG. 10 shows a diagrammatical cross-sectional view of a portion of a prior art electrostatic deflector.

FIG. 9 is a simplified cross-sectional view of a portion of the electrostatic deflector according to the invention. Comparison with the prior art FIG. 10 will elucidate the major improvements made in the invention. First of all, the field in the deflector extends directly from the first to the second electrode; in the prior art it extended above the electrode. Thus results in a larger uniformity and a better controlled field strength. Second, the height z of the electrodes 31-36 is larger in the invention than in the prior art. Since a beamlet 7 is deflected in the invention over the full height z, the deflection occurs more gradually. The field strength needed for a pre-defined deflection angle can thus be reduced. Preferably, as shown in this figure, the height z is larger than the width b of a passing window 40. Third, the deflector of the invention includes isolation windows 41 in addition to passing windows 40. This results therein that beamlets 7 are all deflected in the same direction. In the prior art shown in FIG. 10, the beamlets 7 were deflected in opposite directions. Even though the invention thus has additional strips in comparison to the prior art of FIG. 10, a pitch between a first and a second beamlet is not increased. If desired, the pitch may even be reduced. Such a small pitch is one step towards patterning of smaller critical dimensions in the lithography system of the invention. Though not shown in this figure or in FIG. 10, the prior art deflector comprises specific holes through which individual beamlets pass. In the present invention, a plurality of beamlets passes between a first and a second strip. The construction of the deflector of the invention as a series of freestanding strips does not need additional holes. Additionally, the passing of a plurality of beamlets between a first and second strip instead of through individual holes contributes to uniformity.

One of the advantages of the present deflector is the position of the ground electrode. This ground electrode 25 is not located adjacent to a positively or negatively charged electrode, but is present on the substrate in an area not or substantially not overlying the aperture. Herewith, the distance between such charged electrode and the ground electrode has become much larger. This helps to meet the boundary condition that no electrostatic discharge is to occur with a damage that destroys the deflector. As a consequence, due to the local absence of the ground electrode, the consecutive strips of the first and second electrodes 21, 22 may be located at smaller distances. For reasons of clarity, it is observed that the potential of the ground electrode need not to be equal to that of the ground in an ordinary environment (0V). For example, the ground electrode may be anything between −10 kV and +10 kV. The potentials applied to the first and second electrodes 21, 22 are then potentials around this ground, e.g. −10 kV−/+ 10V. Suitably, the potential difference between the first and second electrode 21, 22 is at most 50V, more suitably at most 20V and even more suitably at most 10V. In various embodiments of the present invention, potential differences of less than 10V have been achieved, for instance 8V, 6V, 5V. Such lower voltages are suitable, as they enable a driving circuit that is robust, nevertheless can be fast, but has still a high bandwidth. Suitably, the bandwidth is at least 5 times the scanning frequency. A bandwidth of 10 times the scanning frequency provides a result that is very appropriate in terms of uniformity. Suitably, the scanning frequency is at least 100 kHz, more preferably at least 500 kHz or even 1 MHz or more.

As shown in FIG. 2, the structure is provided with bondpads 28. These bond pads 28 are coupled to each of the electrodes through interconnects 29. The interconnects 29 are present between ground plane areas 25. This is particularly suitable in case of higher switching frequencies in the order of 500 kHz or more. RF effects then start to be relevant. By implementing the interconnect as a waveguide, such RF aspects are suppressed substantially. It will be understood by the skilled person that other transmission line implementations—stripline, transmission line etc—may be chosen alternatively.

In one embodiment, as shown in FIG. 2, the orientation of the electric field in each passing window 40 is the same. Due to the equal orientation of the electric field, the deflection of all beamlets 7 goes in the same orientation. As a result, the surface area as well as the shape of the projected grid of beamlets 7 is the same, independent or not whether there is a deflection. This principle is embodied, in the shown embodiment in the following manner: the first electrode comprises a first and a third strip, while the second electrode comprising a second and fourth strip. A first passing window is present between the first and the second strip. A second passing window is located between the third and the fourth strip. However, an isolation domain is present between the second and third strip; i.e. the isolation domain is free of a passing window. The isolation domain is suitably a window for manufacturing reasons. Moreover, since the present design allows a reduction in driving voltages, the risk of discharge is substantially reduced.

In a further improvement hereof, a terminating resistance is coupled in parallel to the electrode system of first and second electrode 21,22. Such a terminating resistance may be integrated on the substrate of the deflector. Alternatively, the terminating resistance may be a separate component, such as one or more surface mountable resistors that are assembled separately. It is provided to remove any effects on positioning time of parasitic capacitance in the system. Specifically, the resistance dampens the capacitance and/or the resistance and the parasitic capacitance operate together as filter. As a result, it is achieved that a positioning period is shorter than a writing period. Together these define the time needed for scanning one line, and therewith the scanning frequency.

Most suitably, the resistance is mechanically coupled to a heat removal path. The heat removal path may include a heatspreader, a heatsink and the like. Most relevant is that there is a heat conduction path from the deflector in the vacuum vessel to a location outside the vacuum. The use of such resistance is enabled in that due to the relatively low driving voltage, the potential difference over the electrodes is relatively small. This implies that the heat dissipation over the resistance will be limited. The benefit of the resistance is that the potential difference over the electrodes may be reduced more quickly. Effectively, the parasitic capacitance of the electrode system is damped by the resistor and therewith does not counteract this reduction of potential difference. The reduction of the potential difference directly corresponds to a reduced time to bring a beamlet to its starting position for a subsequent deflection. Therewith, it increases the scanning frequency.

FIGS. 4 and 5 show diagrammatical cross-sectional drawings of the embodiment of FIG. 2. FIG. 4 shows even more clearly the mutual positioning of strips 31-38 and aperture 51 in the substrate. FIG. 5 shows that a strip 31 extends from a first side 101 to an opposite second side 102 of the aperture 51 in this embodiment. In this construction, an electrode effectively constitutes a bridge covering the underlying aperture. That is a construction that is favorable from mechanical stability perspective. There is no membrane carrier acting as a support for the strips above the aperture 51, but the strips are at least partially freestanding. In order to be freestanding, the strips have dimensions and stiffness so as to prevent that the strips 31-38 become flexible and bend in an uncontrollable manner.

This structure is suitably manufactured on the basis of a semiconductor substrate that can be etched and patterned selectively both from its top side and from its bottom side. A silicon-on-insulator (SOI) substrate turns out very advantageous for this purpose; the buried oxide 52 therein acts as etch stop. Alternatively, an etch stop can be created with a pn-junction or other doping transition, as is known in the art. Taking the example of the SOI substrate: the electrodes will be made in the top semiconductor layer (device layer) 53. The substrate 50 is created in the bottom semiconductor layer (handling wafer). The aperture 51 may be created by any type of etching, such as dry etching and wet etching. The skilled person will understand that the silicon wafers preferably are doped, either p-type or n-type. Suitably, a pn-junction is absent so as to prevent current generation within the freestanding electrodes. The doping level may be chosen freely as known to the skilled person in the field of etching and microfabrication.

Suitably, the freestanding electrodes are provided with a coating 54. It has been found that the addition of a coating further improves the uniformity of the electric field. Various materials could be used to improve the smoothness, including dielectric and conductive materials. However, metal coatings are considered most suitable; contrarily to a coating of a dielectric material, a metal coating does not result in additional capacitance in the system. Processes for application of metal coatings are known in the art, including CVD, sputtering, electroplating. An adhesion layer may be used if so desired. More suitably, the semiconductor material of the freestanding electrode is not oxidized prior to provision of the metal coating. The metal coating could be provided on all surfaces of the freestanding electrodes simultaneously, e.g. by a suitable CVD process, but that is not deemed necessary. As an alternative, one might apply the coating from the top and the bottom side while ensuring that also any side surfaces are at least partially covered by conductive material. In such embodiment, one might apply two different materials for the coating. Most preferably is that the freestanding electrode is fully electrically conductive.

Though silicon is well-known and well suited for the generation of freestanding electrodes, alternative materials and processes are not excluded. Such alternatives include the formation of freestanding electrodes on top of a substrate, such as applied for RF MEMS applications, the use of alternative substrate materials including SiC and SiGe instead or—particularly as top layers—in addition to a handling wafer of Si.

Figure 6:
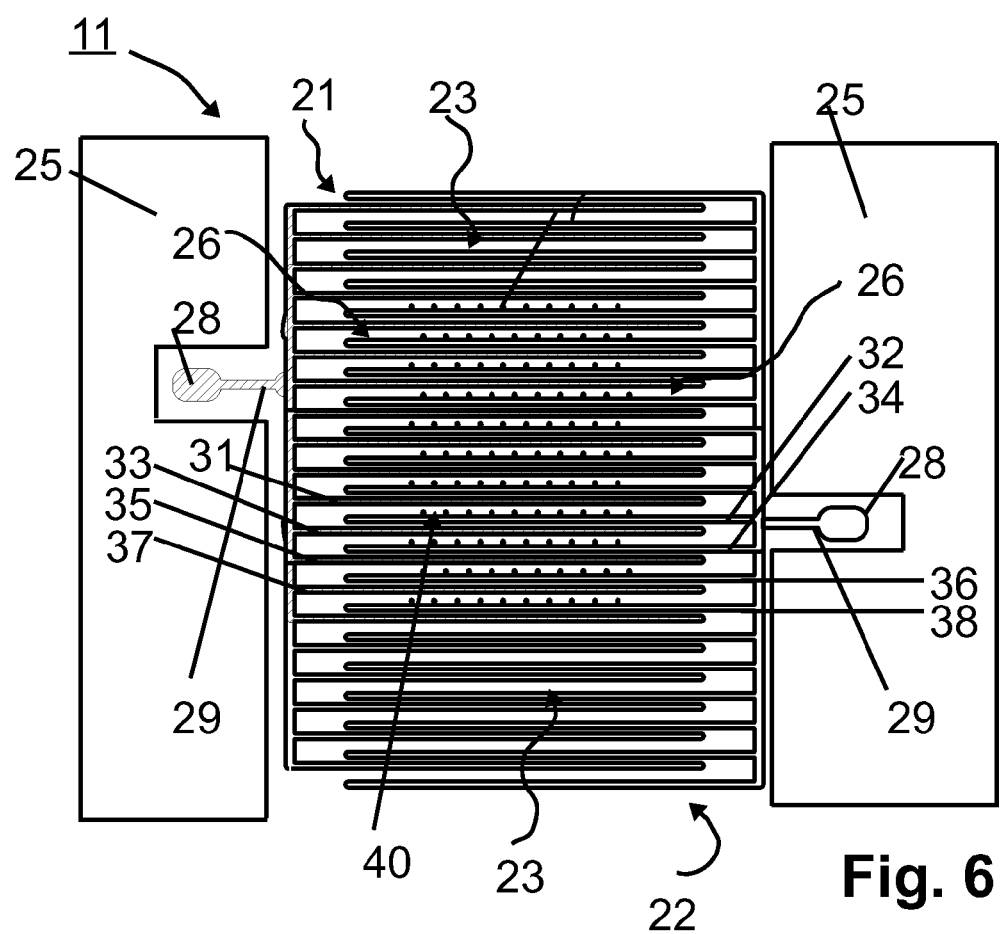
FIG. 6 shows a top view of a second embodiment according to the invention.

FIG. 6 shows a top view of a second embodiment according to the invention. This embodiment shows an interdigitated pair of electrodes 21, 22. Edge zones 23 are present located at opposite edges of the deflector 11. The edge zones 23 comprise a set of parallel oriented strips of the first and the second electrode 21, 22. Nonetheless, no passing windows 40 have been designed within the edge zones 23. Suitably, the design of the strips is equal to the design in the main portion of the deflector 9, but that is not necessary. Although shown to be equal, the edge zones 23 might well be implemented in different designs.

Additionally to the edge zones 23 in a direction parallel to the electric field, it is advantageous to create edge zones 26 in a direction normal to the electric field, i.e. near the distal ends of the freestanding portion of electrodes or strips. Such edge zones 26 support to prevent artifacts in the electric field as a consequence of interactions with the substrate and/or conductors, such as leads and interconnects. Preferably, these edge zones each have an extension of between 2 and 20% of the lateral extension of a strip 31, more preferably between 4 and 12%.

Suitably, the deflector 11 of the invention is assembled together with the projection lens arrangement 12. This is achievable without grave electrostatic discharge problems observed with the prior art planar deflector shown in FIG. 10. The deflector with at least partially freestanding electrode strips and a more uniform field turns out to better withstand electrostatic voltages. The deflector may be assembled near or directly up or below the projection lens arrangement 12.

The scanning deflector 11 of the invention has in one embodiment the further advantage that its thickness is less than that of a prior art deflector. Essentially, the overall thickness of substrate 50 and the electrodes may be less than 500 micrometer, and preferably less than 300 micrometer. This enables a position of the deflector 11 near to the projection lens arrangement 12. Alternative assemblies in which the scanning deflector 11 is near to the projection lens arrangement 12 are not excluded. As a result of the small distance to the projection lens arrangement 12, beamlets 7 being deflected by the scanning deflector 11 have an effective centre of rotation that is very near to the projection lens arrangement 12. As a consequence thereof, aberrations of the projection lens arrangement 12 have less—negative—impact on the spot size of the pixel.

Figure 7:
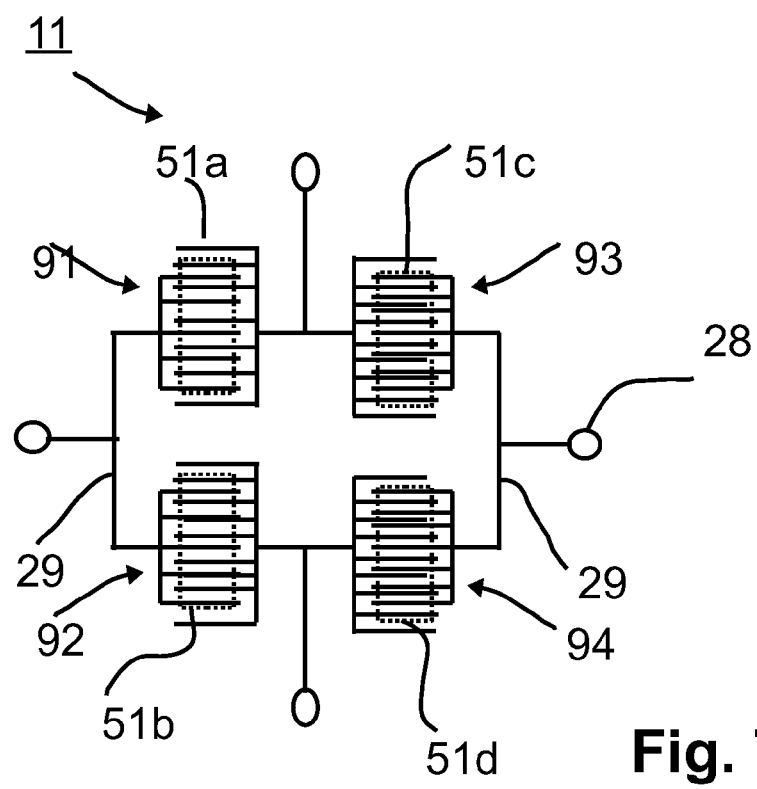
FIG. 7 shows a third embodiment according to the invention.

FIG. 7 shows a third embodiment according to the invention. In this embodiment, the electrode system comprises several portions 91-94. In this example, the number is four, but that is not necessary or limiting. The number might be larger (for instance 9 or 16), it could be smaller (2). The electrode system may be subdivided into a series of portions adjacent to each other, instead of a plurality of blocks. Each of the portions comprises consecutive strips of electrodes 21, 22 that overlie an aperture 51a-d in the substrate 50. In this embodiment, there are four apertures 51a-d corresponding to the four portions 91-94. However, this is not strictly necessary; an additional layer could act as a carrier for the electrode system of all strips. This additional layer would be provided with apertures 51a-d, while still overlying the aperture 51 in the substrate 50. The apertures 51a-d do not need to have a cubic cross-section, e.g. lateral extension may be larger than width or vice versa. Suitably, the consecutive strips in each of the portions form an interdigitated pair of electrodes, but this is not strictly necessary. Also other features as discussed before are applicable to each of the four portions herein.

Figure 8:
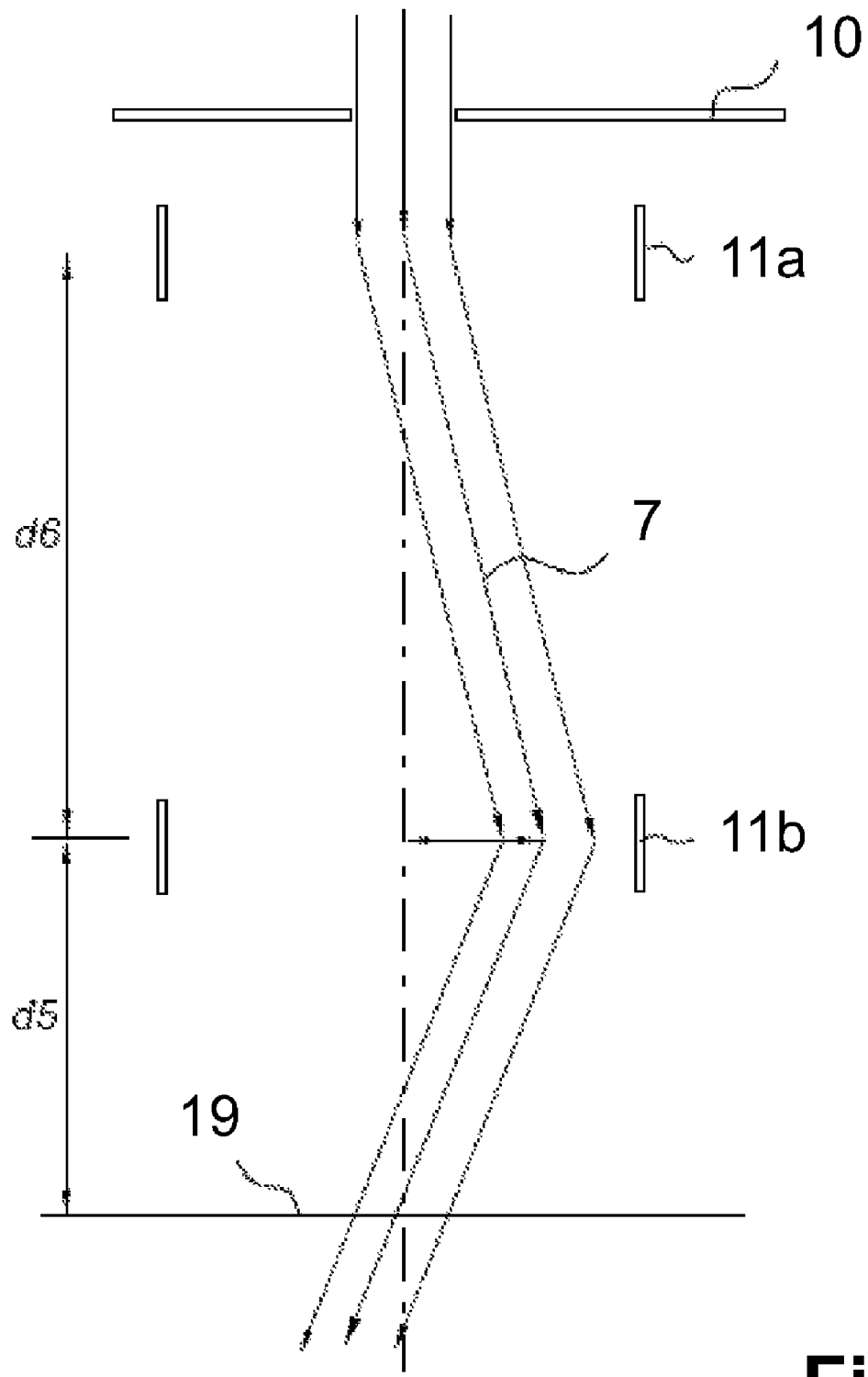
FIG. 8 is a simplified representation in cross section of a deflector system with a deflector according to the invention.

FIG. 8 is a schematic view of an embodiment of a scanning electrostatic deflection system in accordance with the invention. This embodiment comprises a first electrostatic scanning deflector 11a and a second electrostatic scanning deflector 11b. In accordance with the invention, at least one of the deflectors 11a, 11b is a deflector in accordance with the invention. Suitably, both are scanning deflectors in accordance with the invention. With this system design it is accomplished that a beamlet 7 passes through the centre part of the optical axis 0 in the effective lens plane 19 of the projection lens arrangement even when deflected. In this manner, spherical aberrations caused by deflection through the projection lens arrangement are further reduced in comparison with an arrangement with a single scanning deflector 11 according to the invention. An important improvement with this design is that the amount of deflection that can be used is increased, while the resolution of the spot size is not compromised. In this design as shown in FIG. 8, two deflectors 11a and 11b are located one behind the other, each with opposite voltages on their electrodes. For deflection purposes, the sign of these voltages on each deflector 11a, 11b is switched simultaneously. Centering of the deflected beamlet 7 in the effective lens plane 19, and near the optical axis 0 of the projection lens system, is performed by fine tuning the ratios of the deflection angles in view of distance d5 between deflector 9b and the effective lens plane 19 of the projection lens arrangement. The mutual distance d6 between the two deflectors 11a, 11b, and the potential difference applied between the electrodes may also be used in this fine-tuning operation. The applied potential difference in the first scanning deflector 11a and that in the second scanning deflector 11b are herein mutually coupled. They are changed in such a way that the pivot point of beamlet 7 is in the optical plane of projection lens arrangement and crosses the optical axis 0 of the projection lens system. In a suitable implementation, the driving circuits of the first and the second deflector 11a, 11b are thereto controlled through a single controller. Suitably, also portions of the driving circuits, for instance a portion thereof generating the scanning frequency, may be integrated or otherwise coupled together.

Thus, first deflector 11a deflects beamlet 7 at an angle α1 away from the optical axis 0, and second deflector 11b deflects the beamlet 7 back in the opposite direction and at angle α2. In that way, beamlet 7 is deflected over an angle α3 when crossing the effective lens plane 19 of the projection lens arrangement.

In an even further embodiment, not shown in the figures, the apertures are present below the passing windows only.

In a further aspect of the invention, a charged particle system comprising a scanning electrostatic deflector for the deflection of at least one beamlet of charged particles is provided. The deflector comprises a first and a second electrode between which the beamlet passes, wherein each electrode comprises at least one strip, the strips extending substantially in parallel and defining a passing window through which a plurality of beamlets passes, the passing window having a width in a direction normal to the strips, in which direction an electric field is generated upon setting the potential difference between the electrodes, the strips having a height, a width and a lateral direction in three mutually perpendicular directions, the height of the strip being larger than the width of the passing window.

With this deflector it has been achieved to obtain a deflection angle that is in the same order as that of a macroscopic deflector that is operated with a much larger potential difference. That is surprising, since the ratio of the potential difference of a prior art macroscopic deflector and the deflector of the invention may be beyond 5 and even 10 or higher. Moreover, the increased height reduces the stray field component of the electric field, which improves linearity of the field and therewith uniformity of the deflection. Additionally, it turns out that the deflector overall has a thickness that is reduced in comparison to the macroscopic deflector. As a result thereof, the deflector of the invention may be assembled more easily with a projection lens arrangement, leading to reduced aberrations.

Suitably, the deflector comprises freestanding electrode strips.

In another aspect of the invention, a method of scanning a surface with a scanning frequency using an electrostatic deflector is provided. The deflector comprises a first and a second electrode between which a passing window is present. Herein each beamlet scans a line on the surface in a single scanning period. The scanning comprises the positioning of the beamlet to a starting position in a positioning period, and the deflection of the beamlet from the starting position by varying the electric field strength over the electrodes in a writing period. According to the invention, the scanning frequency is in a radio frequency (RF) range. The beamlet is deflected in the same direction in each scanning period. Each beamlet is deflected under operation of the electric field that is oriented in the orientation for each beamlet; moreover, the positioning period is shorter than the writing period.

The present invention effectively enables scanning in a different regime governed by different rules than the prior art. The governing regime is that of high-frequency scanning. More specifically, the high scanning frequency is a frequency within the radio frequency (RF) range, and most suitably in the medium range thereof between 300 and 3000 kHz. As a consequence thereof, the deflection needs to obey rules of RF electronics in order to prevent delays and non-uniformities due to the RF behaviour of the conductors and materials involved. One prominent RF property is the parasitic capacitance. Particularly when changing and reversing voltages, parasitic capacitance may introduce major delays. Additionally, parasitic capacitance tends to lead to deformation of the field, and therewith to a scanning that is easily out of specification.

The challenge observed by the present inventors was thus how to scan a pattern with sufficient speed without running into problems regarding the accuracy of the transferred pattern.

Here, the inventors proposed to deflect beamlets over relatively small angles only, but to carry out the scanning within the radio frequency range. Such smaller deflection angles provide better accuracy and enable a reduction in the applied voltage difference over the electrodes of the deflector. Moreover in order to get an appropriate and reliable result for such high frequency scanning, it was understood that to limit the deflection to a single orientation. Such single orientation deflection requires more repositioning of the beamlets, which costs time. However, a deflection into opposite orientations was found to lead to difference in surface area of the grid of beamlets between the situation with deflection and without deflection. Correction of such difference in surface area was considered undoable at high frequencies. It was the insight of the inventors that repositioning time of the beamlet be reduced significantly by suppressing the parasitic capacitance. Simultaneously, such suppression of parasitic capacitance turned out to reduce deformations of the field and therewith to improve scanning accuracy.

In short, the solution of the inventors of accurate scanning of pattern with sufficient speed included in high-frequency scanning in one orientation only combined with reduction of the repositioning time by suppressing parasitic capacitance.

In one suitable embodiment hereof, the voltages are applied onto the electrodes of the deflector by means of a sawtooth characteristic. The exact sawtooth shape may be tuned to optimize performance. Here, the reverse setting of the voltage results in the desired repositioning, together with mechanical repositioning of the target relative to the lithography system, which is carried out simultaneously.

In a further embodiment, the positioning time is reduced through filtering and/or damping out parasitic capacitance. Such filtering out is suitably achieved by adding components to the deflector so as to obtain filtering performance. Filter topologies are known to skilled persons in the field of analog electronic engineering. Examples include RC filters, RCL-filters, pi-filters and LC filters and networks. Most suitably, use is made of an RC filter. This may be implemented through a terminating resistance.

In an even further embodiment, the voltages applied to the electrodes of the deflector are less than 10V. This voltage reduction is particularly relevant to reduce power losses as a consequence of the filtering. Most suitably, the deflector of the invention is used as the deflector operating at a small potential difference. With freestanding electrodes, this deflector further reduces parasitic capacitance of the deflector and thus supports reduction Suitably, the positioning period has a duration of at most half of the writing period. More suitably, the positioning period has a duration of less than 40%, and most preferred less than 25% of the writing period.

In addition to the preceding description and introductory part, the present invention, apart from the following set of claims, also relates to all non-further elucidated details and aspects in the drawing which are however directly and unambiguously derivable there from by a person skilled in the art.

LIST OF REFERENCE NUMERALS optical axis 0
lithography system 1
electron source 3
beam 4
collimating optical system represented by lens 5
beam splitter 6
beamlets 7
modulator unit 8
beam blanker array 9
beamlet stop array 10
electrostatic scanning deflector array 11
projection lenses 12
target surface 13
light beam 14
plate 15 actuator 16
unit 17
electron optical unit 18
lens plane 19
active area 20
first electrode 21
second electrode 22
edge zones 23
ground electrode 25
edge zones 26
target 24
bond pad 28
interconnect 29
strips 31-38
passing window 40
isolation window 41
substrate 50
aperture 51
apertures 51a-d
buried oxide layer 52
handling wafer 53
metal coating 54
width b of the passing window 40
width a of the strip 31
width c of the isolation window 41
height z of the strip 31
control unit 60
data storage 61
read out unit 62
data converter 63
optical fibers 64
projector 65
portions 91-94
first side 101
second side 102
strips 131, 132, 133 (prior art)

What is claimed is:

1. A charged particle optical system comprising a beamlet generator for generating a plurality of beamlets of charged particles and an electrostatic deflector for deflecting the beamlets,
wherein the electrostatic deflector comprises first and second electrodes adapted for connection to a voltage for generating an electric field between the electrodes for deflection of the beamlets, the electrodes being at least partially freestanding in an active area of the electrostatic deflector,
wherein the electrodes define at least one passing window for passage of at least a portion of the beamlets between the electrodes, the passing window having a length in a first direction and a width in a transverse direction,
wherein the system is adapted to arrange the beamlets in at least one row and to direct a single row of the beamlets through the passing window of the electrostatic deflector, the beamlets of the row extending in the first direction, and
wherein a substantial part of the electrostatic deflector extends beyond the passing window in the first direction.

2. The system as claimed in claim 1, wherein the beamlets in the row are arranged having a pitch between each beamlet, and wherein the substantial part of the electrostatic deflector extends beyond the passing window in the first direction by at least the pitch between the beams in the passing window.

3. The system as claimed in claim 1, wherein, in operation, the electrostatic deflector deflects the beamlets in a direction transverse to the first direction.

4. The system as claimed in claim 1, wherein the electrodes comprise strips having a height, a width, and a length in three mutually perpendicular directions, the length of the strips extending in the first direction and the width of the strips in a direction of the electric field generated between the electrodes, wherein the height of the strips is larger than the width of the passing window.

5. The system as claimed in claim 1, wherein the first electrode comprises a first and third strip, the second electrode comprises a second and fourth strip, wherein a passing window is formed between the first and second strips and between the third and fourth strips, and a domain between the second and third strips is free of a passing window.

6. The system as claimed in claim 5, wherein the domain comprises free space.

7. The system as claimed in claim 6, wherein each electrode comprises a plurality of strips extending in parallel, the strips of the first and the second electrode being interleaved to form interdigitated pairs of electrodes.

8. The system as claimed in claim 7, wherein a plurality of passing windows are present between the interdigitated electrodes, the orientation of the electric field in each passing window being the same.

9. The system according to claim 1, wherein the electric field between the electrodes is less than 100V.

10. The system according to claim 9, wherein the electric field between the electrodes is less than 20V.

11. The system as claimed in claim 1, wherein the electrostatic deflector comprises an edge zone at an edge of the active area in a second direction perpendicular to the first direction, the electrodes comprising strips in the edge zone for generating an edge electric field in the same orientation as the electric field in the active area, and wherein the system is adapted to not direct beamlets towards the edge zone.

12. The charged particle system as claimed in claim 1, further comprising a second electrostatic deflector included upstream or downstream from the electrostatic deflector, the second electrostatic deflector deflecting the beamlets in a different direction or orientation than the deflector.

13. The system as claimed in claim 1, wherein the freestanding electrodes are covered with a coating to provide a substantially electrically homogeneous surface.

14. The system as claimed in claim 13, wherein the coating is a metal coating.

15. The system as claimed in claim 1, wherein a terminating resistance is electrically coupled to one or more of the electrodes.

16. The system as claimed in claim 1, wherein mechanical posts are present inside or overlying the aperture to mechanically support at least one electrode or a strip thereof.

17. A method of scanning a plurality of charged particle beams over a target surface in a maskless lithography system, the method comprising:
providing an electrostatic deflector comprising first and second electrodes, the electrodes being at least partially freestanding in an active area of the electrostatic deflector,
generating a plurality of beamlets of charged particles;
arranging the beamlets in at least one row of multiple beamlets, the row extending in a first direction;
directing a single row of the beamlets through a passing window formed between the electrodes of the electrostatic deflector; and
applying a voltage to the electrodes to generate an electric field between the electrodes for deflecting the beamlets in a scanning pattern.

18. The method as claimed in claim 17, comprising applying voltages of opposite polarity to the first and second electrodes.

19. The method as claimed in claim 18, wherein the voltages of opposite polarity are equal in magnitude and smaller than 10V.

20. The method as claimed in claim 18, wherein the voltages have a frequency in a range of 0 to 10 MHz.

21. The method as claimed in claim 17, wherein the beamlets are positioned at a starting position in a positioning period and deflected from the starting position in a writing period.

22. The method as claimed in claim 21, wherein:
the scanning frequency is in a radio frequency range;
the beamlets are deflected in the same orientation in each scanning period;
each beamlet is deflected under operation of the electric field oriented equally for each beamlet; and
the positioning period is shorter than the writing period.

23. The method as claimed in claim 17, further comprising:
modulating the beamlets using a modulator provided with data of the predetermined pattern retrieved from a data storage; and
focusing the modulated beamlets onto the target surface using a focusing system.

* * * * *